United States Patent [19]

Klein

[11] 3,863,261

[45] Jan. 28, 1975

[54] ELECTRICALLY ADDRESSED APERTURED MODULATOR FOR ELECTROSTATIC PRINTING

[75] Inventor: Enrique J. Klein, Menlo Park, Calif.

[73] Assignee: Electroprint, Inc., Cupertino, Calif.

[22] Filed: May 11, 1973

[21] Appl. No.: 359,288

[52] U.S. Cl. .......................... 346/74 ES, 317/101 CC

[51] Int. Cl. .......................... G01d 15/06, H05k 1/64

[58] Field of Search ......... 346/74 ES, 74 EB, 74 IB; 317/101 CC, 101 F, 101 B; 346/139 C

[56] References Cited

UNITED STATES PATENTS

| | | | |
|---|---|---|---|
| 3,470,563 | 9/1969 | Starr | 346/74 ES |
| 3,582,865 | 6/1971 | Franck | 317/101 CC |
| 3,689,935 | 9/1972 | Pressman | 346/74 ES |
| 3,718,842 | 2/1973 | Abbott | 317/101 F |

OTHER PUBLICATIONS

IBM Tech. Disc. Bull. — Vol. 13, No. 6, 11/70, p. 1529, Jensen — ... Circuit Connector.

IBM Tech. Disc. Bull. — Vol. 13, No. 9, 2/71, p. 2799, Barrington — Attaching Connectors.

*Primary Examiner*—Raymond F. Cardillo, Jr.
*Assistant Examiner*—Jay P. Lucas
*Attorney, Agent, or Firm*—Townsend and Townsend

[57] ABSTRACT

Modulated apertured non-contact electrostatic printing wherein a stream of ions is modulated by passage through one or more rows of electrically addressed apertures containing bipolar electrostatic fringing fields of force into a mist of uncharged toner particles to impinge upon such particles causing them to become charged and attracted onto a print receiving medium. Specified particle modulator constructions wherein a plurality of very small closely spaced modulating apertures are positioned on a flexible printed circuit board having printed circuit lead lines extending between each aperture and printed terminal pads. The terminal pads are arranged in straight parallel rows for attachment to conventional printed circuit card edge connectors and, thereby, to printed circuit cards carrying control circuitry. Each of the printed circuit leads joining one of the apertures to one of the terminal contact pads is comprised of a first section extending from the aperture in a direction substantially perpendicular to the rows of apertures, and a second section extending in a direction substantially parallel to the rows of apertures between the distal end of the first section and one of the terminal contact pads. The circuit board is fabricated from a flexible dielectric substrate having a continuous electrically conductive backing. The printed circuitry, including the aforementioned lead lines and terminal contact pads, appears upon the opposite side of the substrate. The terminal contact pads are positioned on a flexible flap cut in the flexible circuit board and are electrically connected to conventional circuit card edge connectors which have two rows of terminal prongs depending therefrom by wrapping the flap across an elongate filler block with the terminal contact pads facing upwardly in alignment with the terminal prongs, wedging the flap between the rows of terminal prongs and the filler block and soldering the terminal prongs to the pads.

31 Claims, 18 Drawing Figures

ELECTRICALLY ADDRESSED APERTURED MODULATOR FOR ELECTROSTATIC PRINTING

The present invention relates to a new and improved system for electrostatic reproduction and more particularly to an improvement in modulated aperture noncontact electrostatic printing of the type wherein a stream of charged particles, preferably ions, is modulated by passage through one or more rows of individually addressed apertures containing bipolar electrostatic fringing fields. A receiving medium is translated past the aperture rows and receives the modulated particle stream or additional particles introduced into the modulated stream, for line-at-a-time or line scan printing operations. The present invention is specifically concerned with particle modulator constructions whereby, for enhanced printing resolution and speed, a large number of very small apertures can be closely spaced in one row or in two or more closely spaced rows and yet provide separate electrical access to individual apertures by means of novel printed circuit configurations and structures. The present invention is also concerned with novel apparatus for mounting the particle modulator. The invention is useful in a wide range of applications including document copiers and computer printout devices.

One type of electrostatic printing apparatus for which the present system is intended employs a modulator element designed to support a double layer charge at apertures in the modulator to produce fringing fields of electrical force within the apertures, including blocking fields, for modulating an ion stream in accordance with an image to be reproduced. As set forth in commonly assigned U.S. Patent application Ser. No. 101,681 filed Dec. 28, 1970 now Pat. No. 3,779,166 and entitled ELECTROSTATIC PRINTING SYSTEM AND METHOD USING IONS AND TONER PARTICLES, the present invention may be employed in a system wherein an ink mist is introduced into the path of modulated ion stream so that the ions impinge upon the ink mist particles causing them to become charged and then accelerated by an applied electrical field toward a print receiving medium. Specially constructed modular elements for use in systems of this sort are shown in commonly assigned U.S. Patent application Ser. No. 864,022 filed Oct. 6, 1969, entitled ELECTROSTATIC LINE PRINTER, now U.S. Pat. No. 3,689,935.

A printing apparatus of this type prints an unlimited variety of useful shapes, including alphanumeric characters, is capable of printing at rates far in excess of conventional mechanical printers, and yet operates almost silently.

The quality and resolution of this type of electrostatic printer increases inversely to the size and directly to the spatial density of modulating apertures. While, according to the present invention, an electrostatic printer can be constructed using only a single linear array of apertures, so that one horizontal strip of the printed line is printed simultaneously, the use of additional vertically spaced linear arrays displaced horizontally from each other so that apertures in adjacent linear arrays are staggered allows for more complete coverage of a printed line and, therefore, better resolution. This arrangement also allows a significant increase in the printing speed since several vertically spaced horizontal strips of the printed line can be printed simultaneously and the significance of gate-switching time lags reduced.

Hence, to obtain increased resolution and speed, it is necessary to utilize very small apertures as closely spaced as possible. But since this type of electrostatic printing requires that each aperture be electrically controlled individually, an electrical connection must be made to each aperture and the crowding of connections becomes a limiting factor on the number of apertures of a given size that can be located in a given area.

The apparatus of the present invention comprises a flexible printed circuit board containing both the modulating apertures and the necessary electrical leads. The leads are arranged in a pattern which facilitates electrical connections to the apertures. The pattern further allows for a simple method of electrically connecting the leads on the flexible circuit board to a set of conventional printed circuit cards with conventional printed circuit card edge connectors. The circuit boards, both conventional and flexible, and the edge connectors, are supported in a configuration that optimizes the number of electrical connections possible, thus optimizing the resolution and speed of an electrostatic printer utilizing modulators of the type described.

One object of the present invention is, therefore, to improve the resolution, and to increase the speed of modulated aperture electrostatic printers.

An advantage of the present invention is that it allows for a large number of electrical connections to be made to an apertured modulator.

Another advantage is that electrical connections to the apertured modulator can be made simply, by the use of a conventional printed circuit card edge connector.

These and other objects, features, and advantages of the present invention will be more readily apparent after reading the following detailed description with reference to the accompanying drawings wherein:

FIG. 1B is a schematic diagram of a modulated aperture electrostatic particle modulator biased with the biasing voltages deactivated so that charged particles may pass through;

I. Modulated Aperture Electrostatic Printing

A. General Background:

The present art of modulated aperture electrostatic printing has been an outgrowth of the early work in electrostatic screen printing by Samuel B. McFarlane Jr., set forth in commonly assigned U.S. Pat. Nos. 3,220,831, 3,220,833, and 3,339,469. In this early work a screen or other modulator was first prepared with an electrostatic charge corresponding to the image to be reproduced. This imaged modulator was dusted with charged toner particles and then the dusted screen exposed to an overall projection field which attracted the toner particles from the modulator across an air gap to paper or other print receiving medium to which it was fixed with heat or otherwise. The toner pattern was transferred across the air gap without substantial disruption.

Later work, disclosed in commonly assigned U.S. Pat. Nos. 3,625,604 and 3,645,614, enabled the toner particles to be projected directly from the toner source through the modulator (usually a screen) onto the print receiving medium or to a transfer surface, thus eliminating the step of dusting the modulator. The modulator could also be used to modulate an ion stream, as disclosed in commonly assigned U.S. Pat. No. 3,582,206, for subsequent development in a variety of ways. Importantly, this kept toner away from the screen and avoided the need for costly and time consuming screen cleaning steps. In addition, the low mass ions required relatively low gating voltages and smaller apertures, by comparison to the larger, heavier toner particles.

As disclosed in commonly assigned U.S. Pat. No. 3,689,935 modulators can be designed to accept a stream of electrical signals, such as from a computer, to rapidly vary the charge pattern on the modulator. High speed printing operations, such as are desired in computer printout applications, can be carried out with electrically addressed modulators. Electrically addressed modulators, as opposed to optically addressed or xerographically imaged modulators, are the type to which the present invention applies.

Figure 1A:
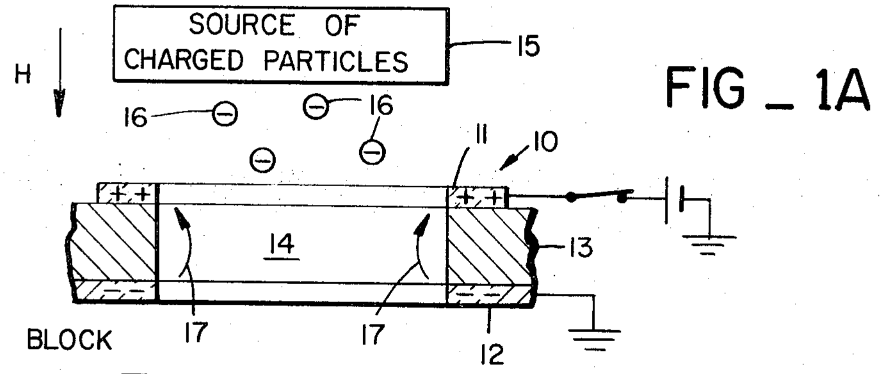
FIG. 1A is a schematic diagram of a modulated aperture electrostatic particle modulator biased to provide blocking fields.
Figure 1B:
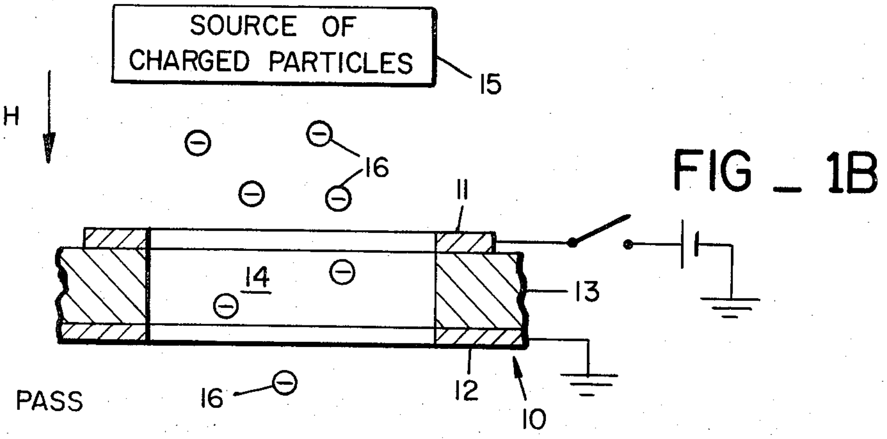

B. Electrically Addressed Particle Modulators:

FIGS. 1A and 1B illustrate the effect of double layers of charge upon the passage of charged particles through an electrically addressed particle modulator 10. The modulator 10 has an aperture 14 with first and second conductive layers 11 and 12 carried on a thin electrical insulator layer 13. The ratio of insulator 13 thickness to aperture 14 diameter (T/D ratio) is less than 1.00 and preferably about 0.25. The conductive layer 11 facing the source 15 of charged particles 16 is biased with opposite polarity from the charged particles 16 and the opposed conductive layer 12 is grounded, so that a double layer of charge is formed at the aperture 14 creating electrostatic lines of force or fringing fields 17 within the apertures 14 which tend to block the passage of charged particles 16 therethrough, as shown. FIG. 1B illustrates how charged particles 16, under the influence of overall projection field H pass through the modulator 10 when the modulator bias is removed. If the charged particles are toner or ink, they can be deposited directly on the print receiving medium; however, it is preferred that the charged particles be gaseous ions. A modulated ion stream is developed in the manner shown in FIG. 2.

Figure 2:
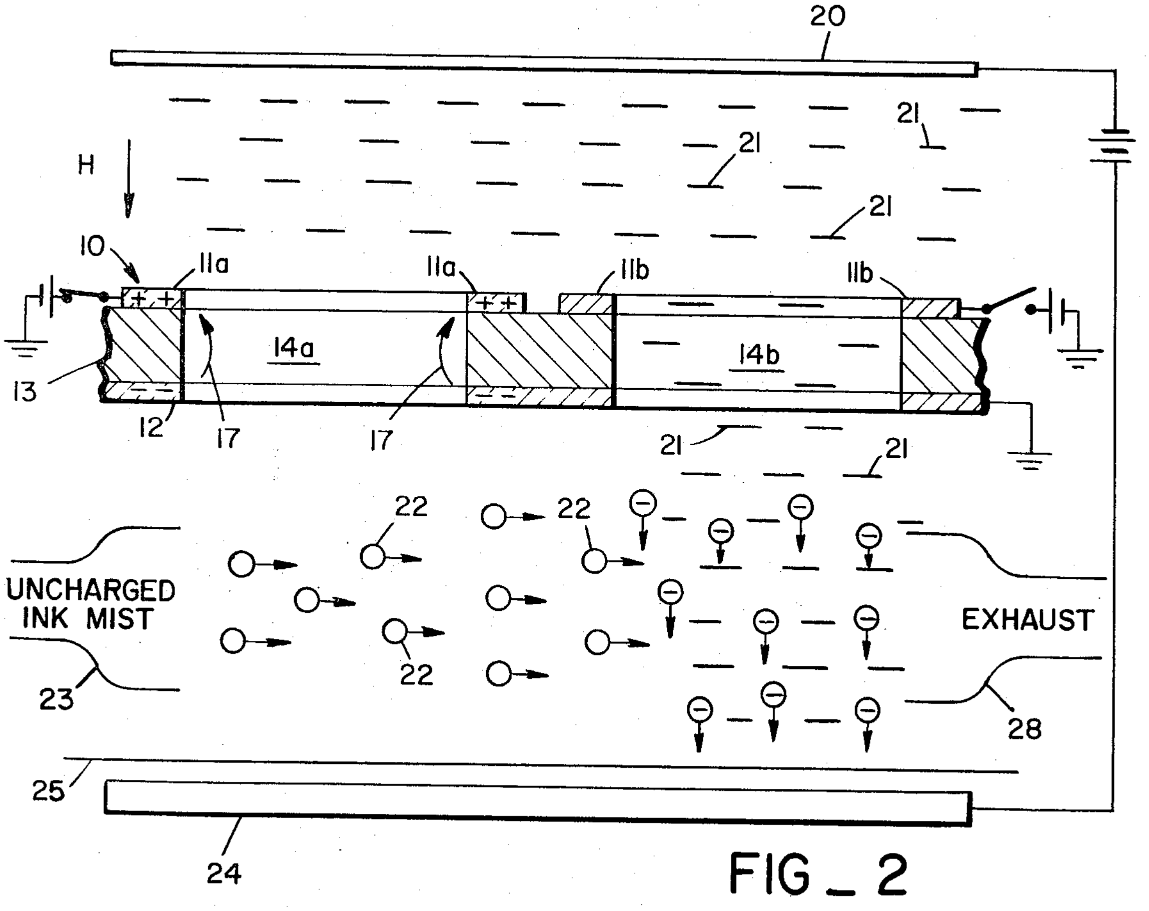
FIG. 2 is a schematic diagram of a modulated aperture electrostatic particle modulator in a system wherein ions are modulated thereby and the modulated ion stream developed by impingement into an uncharged ink mist prior to deposit on the print receiving medium.

C. Printing with Ions and A Toner Mist:

FIG. 2 illustrates a system for electrostatic printing wherein a stream of ions which has been modulated with an electrically addressed modulator 10 in the manner shown in FIGS. 1A and 1B is developed by directing the modulated ion stream into a cloud or mist of uncharged solid toner particles or liquid ink droplets. In FIGS. 1A, 1B and 2 corresponding elements are correspondingly numbered. Specifically, FIG. 2 shows ions 21 from an ion source, i.e. corona wire 20, being flooded on a particle modulator 10. The segmented upper conductor layer 11*a* is charged, establishing fringing fields 17 in the aperture 14*a* which block ions 21 from passing therethrough. By comparison, segment 11*b* of the upper conductor is not charged and ions 21 pass through the aperture 14*b* (under the influence of overall projection field H) established between the corona wire 20 and reverse polarity electrode 24 (also referred to as the "backbar" 24) and impinge upon uncharged particles of ink 22 supplied from uncharged ink mist generator 23. Uncharged ink particles 22 which are struck by the ions 21 become charged and are accelerated by the field H onto the paper 25 interposed therein. Toner particles 27*b* which are not struck by ions 26 continue laterally to an exhaust duct 28. When liquid ink particles are employed, as is preferred, the system has the important advantage that it prints on ordinary, untreated paper and does so without a further developing step and or an intermediate transfer surface. The foregoing is set forth in greater detail and scope in commonly assigned U.S. Patent application Ser. No. 101,681 of Pressman et al. filed Dec. 28. 1970.

Figure 3:
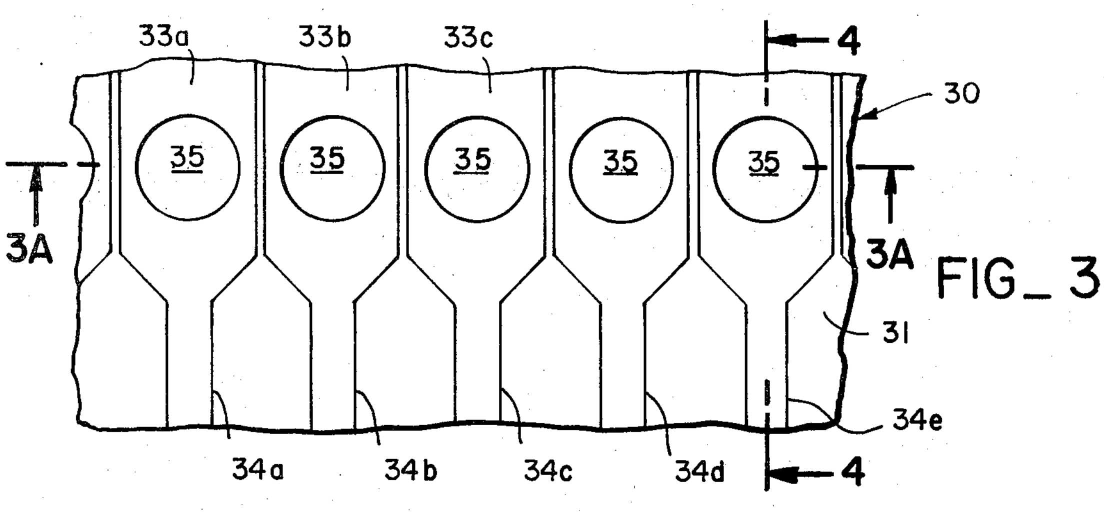
FIG. 3 is a fragmentary plan view and FIG. 3A a fragmentary side cross-sectional view of a line or bar modulating element for modulated aperture electrostatic line printing.
Figure 3A:
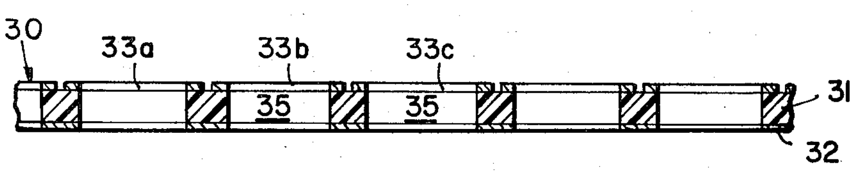

FIGS. 3 and 3A illustrate an electrically addressable particle modulator wherein the modulating element 30 consists of an elongate length or bar of insulating material 31 with a continuous layer of conducting material 32 on one side and a segmented conductive layer 33 on the other. Segmented conductive layer 33 consists of individual insulatively isolated segments 33*a*, 33*b*, 33*c*, etc. The element 30 is formed with a row of apertures therethrough, each aperture surrounded by a conductive segment 33*a*, 33*b*, 33*c*, etc. An electrical lead is provided to the continuous conductive layer 32 for applying a uniform potential across one face of the insulative layer 31. A plurality of electrical leads 34*a*, 34*b*, 34*c*, etc., are provided one for each of the conductive segments 33*a*, 33*b*, 33*c*, etc., so that a different potential can be applied to each of the segments for creating selectively different double layers of charge at each of the apertures 35 in accordance with a pattern to be reproduced. A particle modulator constructed in this manner, sometimes referred to as a "line printer", is employed in line-at-a-time printing operations, such as in facsimile printing or computer data printers. In the usual case, the print receiving medium is translated past the particle modulator and ink particles are deposited on the medium in line patterns in accordance with selected electrical signals supplied to the segmented conductors 33*a*, 33*b*, 33*c*.

Figure 4:
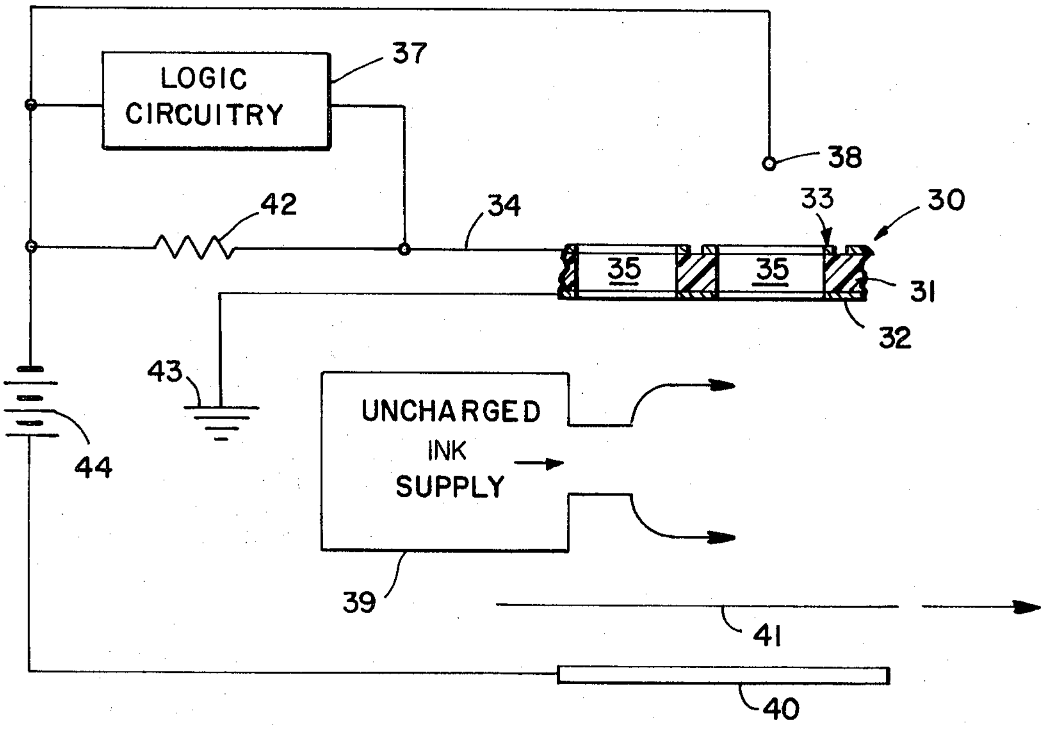
FIG. 4 is a schematic diagram of a modulated aperture electrostatic printing system with ions and an ink mist wherein the aperture is electrically addressed with logic circuitry.

FIG. 4 is a diagram for a computer printer utilizing the particle modulator 30 illustrated in FIGS. 3 and 3A, with corresponding parts numbered accordingly. Each of the conductive segments 33 is connected by a separate electrical lead 34 through resistance 42 and appropriate logic circuitry 37 to an electrical power supply 44. Continuous conductive coating 32 is connected to a fixed potential or ground 43. As in the preferred system of FIG. 2, uncharged ink particles from supply 39 are introduced into a stream of ions emanating from corona wire 38 after they have been modulated by passage through the modulator aperture 35. Ions impinging upon ink particles become charged and are attracted to the print receiving medium 41 by the backbar electrode 40. The print receiving medium is translated continuously transversely to the ion flow for printing.

Figure 5:
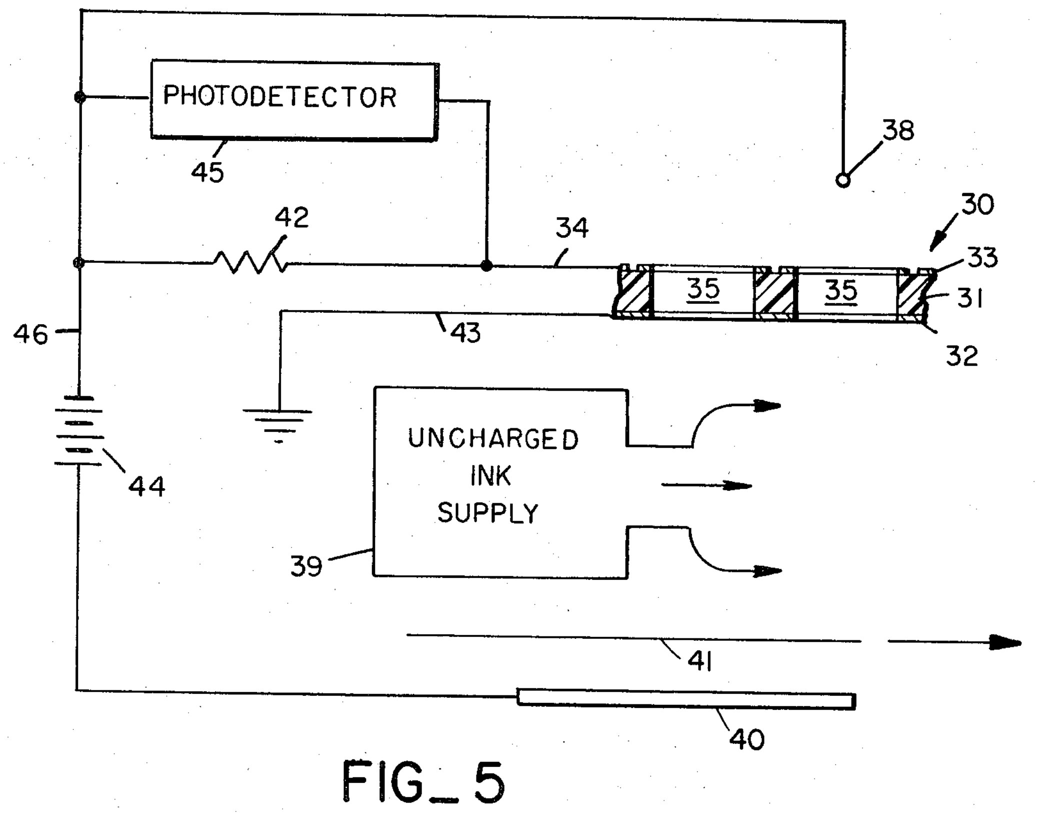
FIG. 5 is a schematic diagram of a modulated aperture electrostatic printing system with ions and an ink mist wherein the aperture is electrically addressed with optically generated electrical signals.
Figure 5A:
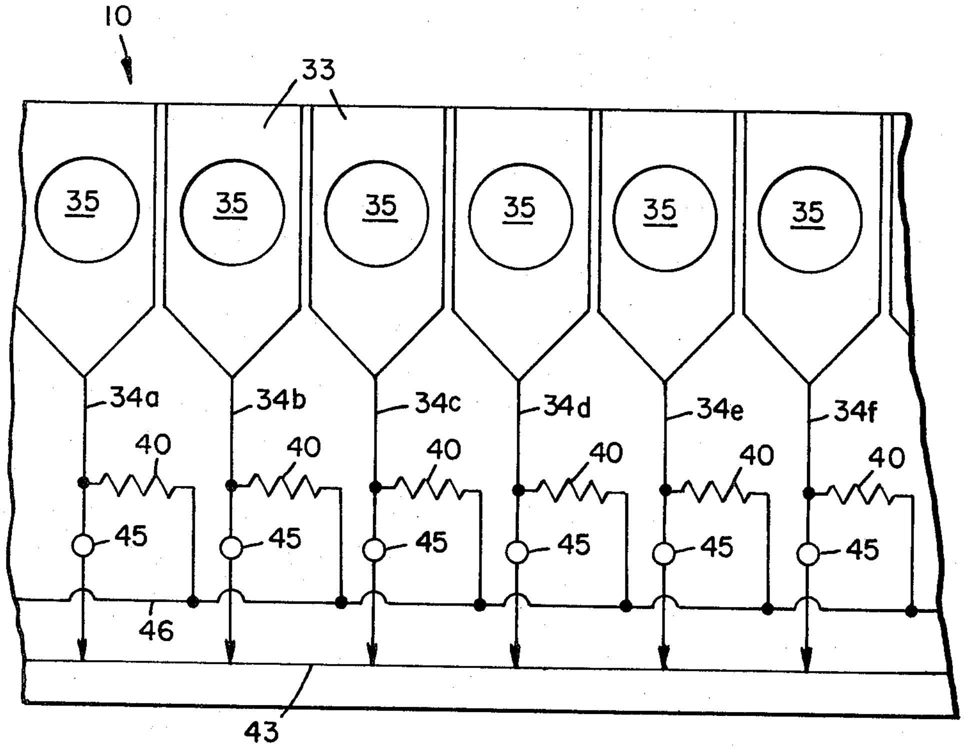
FIG. 5A is a schematic diagram illustrating the system of FIG. 5 employed with linear arrays of segmented apertures and photoreceptors.

Electrically addressed systems according to the present invention can also include systems of the type employing modulator and photodetector arrangements as shown in FIGS. 5 and 5A where a linear array of photodetectors 45 detect an optical image at a distance from the modulator 30, transforming linear segments of such image into electrical signals carried to the modulator 30 by a plurality of separate electrical leads 34*a*, *b* and *c*. According to this arrangement, each of the conductive segments 33 of the segmented conductive layer of particle modulator 30 is connected by an electrical lead 34 through a photoconductor cell 45 to a ground potential 43 or other fixed potential. At the same time, an electrical power supply is connected by way of lead 46 through resistances 43 to each of the segments 34 of the segmented conductive layer. The photoconductor cells 40 can be addressed in any manner desired, such as by sweeping an image continuously across the row of photoconductor cells or sweeping an image line-by-line across the row of photoconductor cells.

Thus, it will be seen that while the representative systems illustrated according to the present invention in FIGS. 4, 5 and 5A differ in the means employed to generate electrical addressing signals, they share a common need for individual electrical connection 34 between a large number of small closely spaced linear oriented conductive segments 33 and their associated electrical components, such as the resistors 42 and logic circuitry 37 of FIG. 4. Accordingly, the present invention, as set forth in the following description, relates to specific means and techniques for achieving that end.

II. Flexible Circuit Board Particle Modulators Access Patterns and Assemblies

Figures 6, 6A, 6B, 6C, 7:
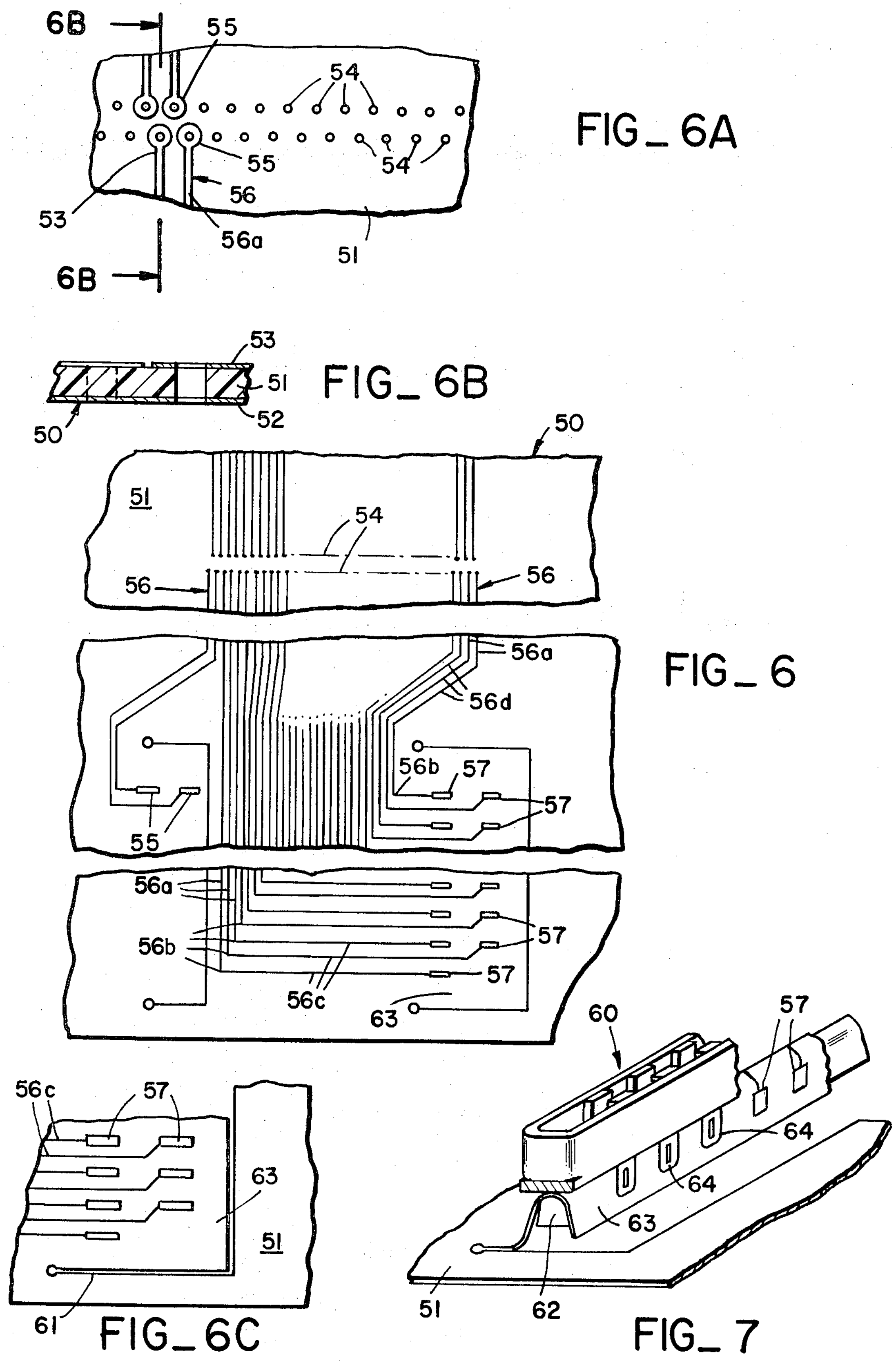
FIG. 6 is a fragmentary plan view of the flexible circuit board. In this figure, it should be noted that the horizontal dimensions are expanded relative to the vertical for better clarity.
FIG. 6A is an enlarged fragmentary plan view of the aperture region of the flexible circuit board of FIG. 6.
FIG. 6B is a fragmentary side view of FIG. 6A taken along lines 6B.
FIG. 6C is an enlarged fragmentary plan view of the terminal pad region of FIG. 6.
FIG. 7 is a fragmentary perspective view of the connection between the conventional printed circuit board edge connector and the flexible circuit board.

A. The Flexible Circuit Board:

Referring now to FIG. 6, a flexible circuit board type of particle modulator is shown generally at 50. The board 50 is constructed of a thin flexible substrate 51 of plastic sheet, such as a polyimide sheet sold under the registered Trademark "Kapton", or other suitable flexible dielectric or electrically insulating material. A continuous electrically conducting layer 52 is applied to one surface of the substrate 51 and a plurality of electrically isolated conductive segments 53 is applied to the opposite side of substrate 51. Each segment 53 terminates at one end in an annular portion 55 surrounding one of the apertures 54. The apertures 54 are arranged in two parallel horizontal rows with the apertures in one row horizontally displaced from the apertures in the next row by one-half pitch so that apertures in adjacent rows are staggered. The segments 53 can be fashioned by conventional printed circuit methods and each provides an electrically conductive circuit between one of the modulating apertures 54 and one of the contact pads 57. Each segment 53 is thus continuous and consists of annular portion 55 surrounding an aperture 54, at one end, connected to a terminal contact pad 57 by a thin, line-like (sometimes hereinafter "linear") lead portion 56. Accordingly, each electrical device or current modulating aperture is provided with a separate electrical lead. In the preferred arrangement illustrated in FIG. 6, each linear lead portion 56 of a particular segment consists of a longitudinally or vertically extending portion 56*a* connected to a horizontally or laterally extending portion 56*c* at a right angle bend or elbow 56*b* at the distal end of the vertical portion 56*a*. Some of the vertical lead portions 56*a* include angled portions 56*d* as will be more fully explained herein. The horizontal lead portions 56*c* lie generally parallel to the rows of apertures 54, whereas the vertical lead portions 56*a* lie generally perpendicular thereto. The elbows 56*b* of the linear lead portions 56 are thus at the opposite ends of the vertical lead portions 56*a* from the apertures 54.

The patterns and arrangements of the printed circuitry 53 in the manner of the present invention allow for connections between a set of relatively narrowly spaced apertures 54 and a set of relatively widely spaced contact pads 57. In this regard it will be noted that the horizontal center spacing between the apertures 54 in a given row is less than the vertical center spacing between the pads 57, as desired. Moreover, vertical spacing between the terminal pads 57 can be increased or decreased as desired to accommodate existing, conventional edge connectors, such as are shown, for example, at 60 in FIG. 7; and, that within relatively wide limits, the variations in pad spacing can be made independently of aperture spacing. I refer to the foregoing as an "access circuit" or "access pattern of printed circuitry" and it will be appreciated that this feature has enabled electrical connections to be made between a source of data signals and a large number of closely positioned small apertures, as required or desired for high density printing in a modulated aperture printing system of the type described. It will also be appreciated that by printing access circuitry on a flexible circuit board, the necessary connections can be made in an efficient and economic manner with conventional connectors.

The connection of the printed circuit board with conventional edge connectors is illustrated at FIG. 7. As shown in FIGS. 6 and 6C, a U-shaped slit 61 is cut through the circuit board 51 to form a flap 63. It will be noted that FIG. 6 shows only that portion of the circuitry of the entire flexible circuit board associated with a single flap 63. This basic circuitry pattern is repeated by translation of the pattern along a line parallel to the row of apertures 54, and then essentially by reflection through that line and translations parallel to it as required to accommodate any numbers of apertures 54. The reflected patterns may be displaced laterally or otherwise modified slightly to stagger the apertures and/or flaps as required or desired, as will be apparent. Thus, of the total number of paired apertures 54 and terminal pads 57, there is a separate group of such paired apertures and pads associated with each flap 63, and each such group has a pattern of leads 56 similar or identical to the patterns of leads 56 in every other grouping. The pattern in each such grouping typified by the pattern shown in FIG. 6 wherein the flap 63 is positioned at the right hand side of the pattern near the horizontal edge of the circuit board 51. The flap is formed to fold back along a line perpendicular to the row of apertures 54 and the terminal pads 57 are positioned on the flap in two horizontally spaced rows. Terminal pads 57 in one vertical row are aligned with those terminal pads 57 in the adjacent row. The terminal pad at the outermost edge of the circuit board 51 (hereinafter the "first terminal pad" of the group) is connected to the aperture 54 positioned at the furthest left-hand end of the row of apertures 54 in the group (the so-called "first aperture" of the group). The lead 56 between this particular aperture-terminal pad pairing consists entirely of a straight vertical section 56*c* joined at an elbow or junction 56*b*. The aperture 54 to the immediate right of the first aperture 54 (the so-called "second aperture" of the group) is associated with the "second terminal pad", positioned in the row opposite the first terminal pad. As shown in FIG. 6, the second terminal pad 57, instead of being horizontally aligned with the first terminal pad 57, is spaced a short distance inwardly (i.e. toward or proximally to the row of apertures 54) and is horizontally aligned with the third terminal pad; however, it will be readily appreciated in an alternate pattern, the second terminal pad 57 could be positioned in horizontal alignment with the first terminal pad. The "last" aperture in the group, i.e. aperture located at the right-hand end of the row of apertures 54 in the group, is associated with one of the two terminal pads 57 located closest to the row of apertures 54. The vertical lead section 56*a* associated with the last aperture-terminal pad pair is, instead of being a continuous straight line, interrupted by an angled portion 56*d*, which displaces the vertical lead section 56*a* to the left as it progresses from the aperture 54 to the junction 56*b*. All vertical lead sections 56*a*, except the one at the furthest left-hand side of the group and possibly one or two others immediately adjacent to it, have visibly discernible angled portions 56*d*. The angles of the angled portions relative to a line perpendicular to the row of apertures increases gradually from left to right. For example, as shown, these angles begin at 0° in angled portions at the left-hand side of the group and increase to about 45° in angles at the right-hand side of the group, although it will be appreciated that this angle could increase to 90° as required by the geometry of the access pattern. It will be noted further that the junction points 56*b* lie in a line which runs at an angle to the row of apertures from a distal or outer junction point associated with the first aperture-terminal paid pairing to an inner or proximal junction point associated with the last aperture-terminal pad pair. As the angle of the junction point line relative to a line parallel to the row of apertures 54 increases, the vertical spacing between the centers of the terminal pads 57 can be increased proportionally. It will be appreciated that more or less aperture-terminal pad pairs may be included in a given connector grouping, as desired, or as may be dictated by the numbers of terminals in a conventional off-the-shelf edge connector 60, as shown in FIG. 7. Further, while FIG. 6 illustrates an access pattern wherein the first or longitudinal section 56*a* of the linear lead 56 extends in a direction perpendicular to the second or lateral section 56*c* of the lead 56, and angle of intersection (the junction angle at 56*b*) of the first and second sections 56*a* and 56*c* could be any angle between 0° and 180°, although 90°, as shown, is generally preferred. In addition, while the angles at all junctions 56*b* in a given grouping are preferably the same, they could be variable, for example, to give the second sections 56*c* a fanned appearance as would be the case if the first junction angle 56*b* (at the lefthand side of the grouping) were 170°, the last junction angle 56*b* were 10°, and all other gradually varied in sequence therebetween.

In an ion modulation system, preferred aperture size is on the order of 0.01 inch diameter with center spacing of 0.02 inch. Due to the relatively low mass of ions, low voltage gradients on the order of 150 volts may be employed, and insulators constructed of polyimide may be employed in thicknesses on the order of 0.002 inch. These dimensions and voltage gradients must be increased as necessary if other larger and/or heavier charged particles, such as toner particles, are employed.

Figure 8:
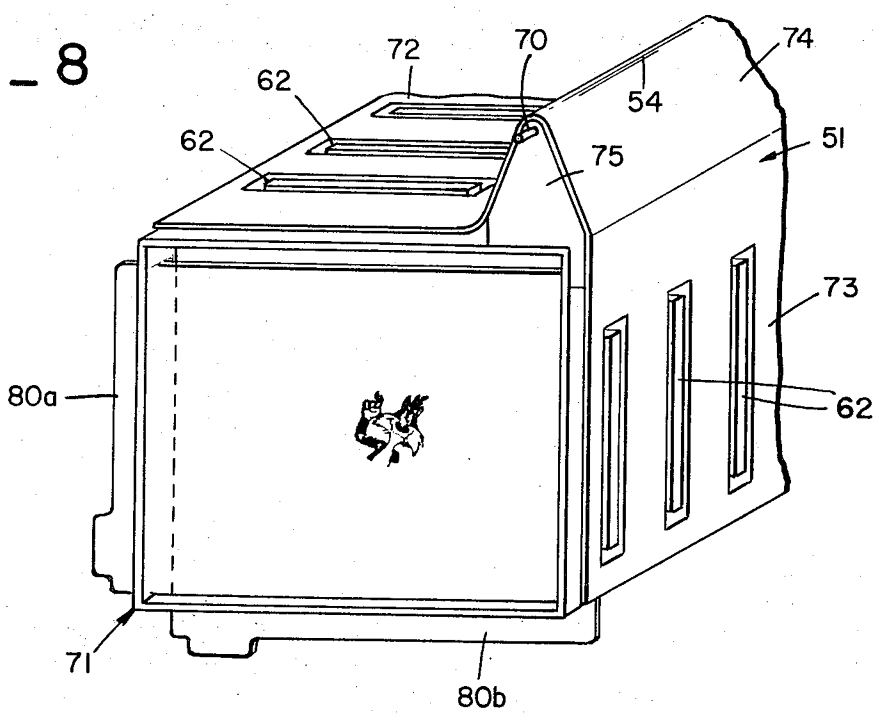
FIG. 8 is a perspective view from above of a flexible circuit board of the type shown in FIG. 6 mounted on a card cage according to the present invention.
Figures 8A, 8B, 8C:
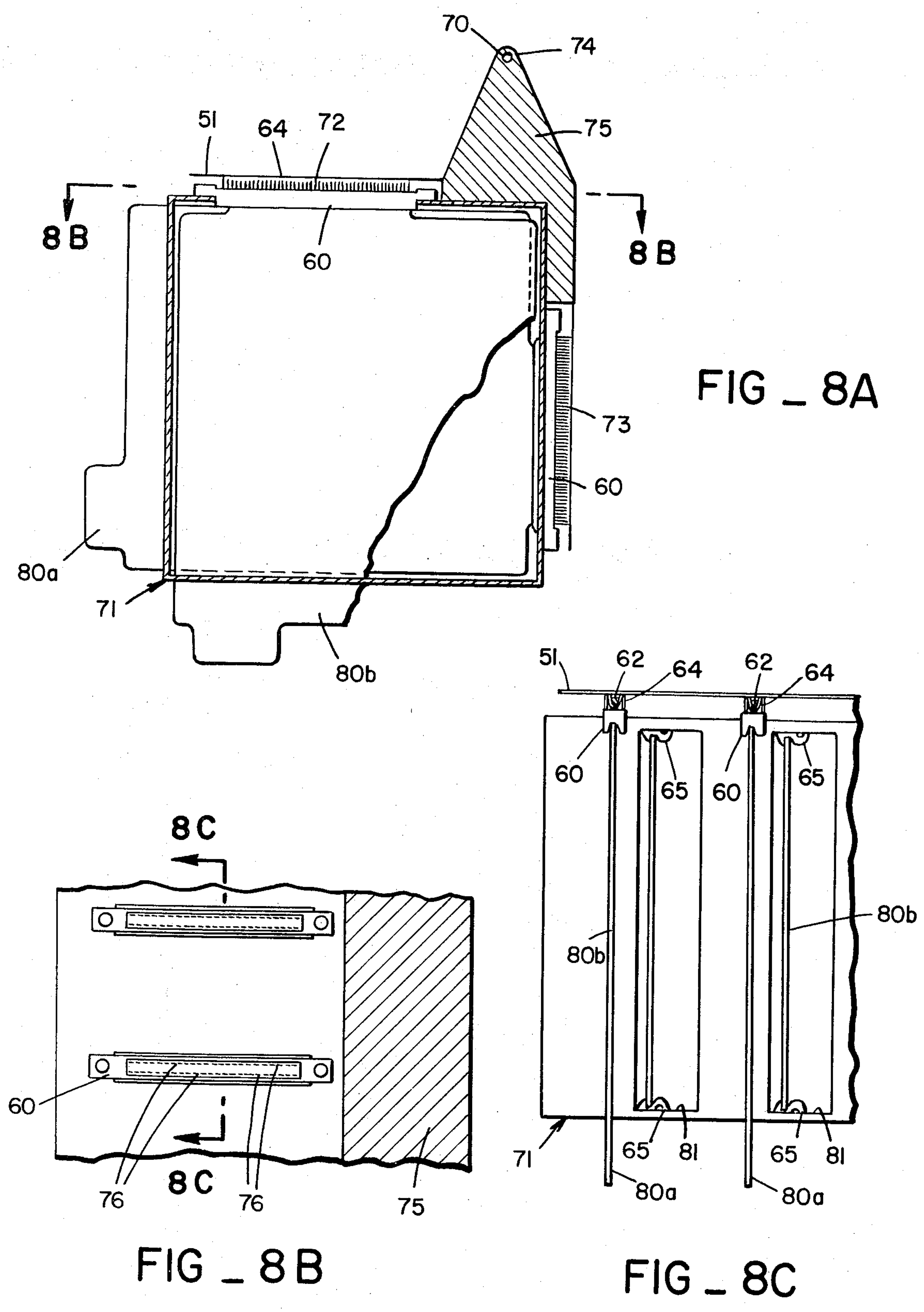
FIG. 8A is a side sectional elevation with portions cut-away of the card cage assembly illustrated in FIG. 8.
FIG. 8B is a fragmentary sectional view of the interior surface of the card cage wall of card cage illustrated in FIG. 8 carrying edge connectors.
FIG. 8C is a fragmentary view of the card cage from the side of the card cage from which the card apertures are formed.

B. Mounting Assembly for the Flexible Circuit Board:

In FIG. 7, the flap 63 of the flexible circuit board 51 is shown connected to terminals of a conventional printed circuit board edge connector 60. Filler block 62 wedges the surface of the flap 63 between and against the opposed rows of pronglike edge connector terminals 64. Reliable electrical connections may be assured with solder. FIGS. 8–8C illustrate one embodiment of the mounting assembly of the present invention wherein a flexible circuit board 51 of the type illustrated in FIG. 6 is mounted on a card cage 71. So mounted, the surface of the circuit board 51 assumes an irregular shape with a central crest 74 and first and second lateral planar portions 72 and 73 respectively disposed at 90° relative to one another, as though folded across the edge of a box. The rows of apertures 54 of the circuit board 51 are disposed along the length of the crest portion 74. Crest support 75 positions the crest portion 74 and carries corona electrode wire 70 just beneath and parallel to the rows of apertures 54. The flexible circuit board 51 is mounted with its printed circuit leads 56 faced downwardly toward the cage 71. Conventional edge connectors 60 are connected to the circuit board 51 in the manner best illustrated by FIGS. 8A–C. Filler blocks 62 are visible in the circuit board openings left by the folded flaps 63. Conventional printed circuit cards 80*a*, *b* are inserted edgewise into openings 81 in the card cage 71 so that their terminal bearing edges wedge between the terminal contacts 76 of the edge connectors 60 in the conventional manner. The non-terminal bearing edges of circuit cards 80*a*, *b* are suppported by guides 65. The cards 80*a* inserted from one side of the cage 71 alternate with the cards 80*b* inserted from the adjacent side of the card cage 71. Alternate cards 80*a* and 80*b* are inserted from directions perpendicular to each other and plug into edge connectors 60 located at the opposite sides of the card cage 71 from the entry slots 81. Thus, the cards 80*a* and 80*b* connect to circuitry carried on portions 73 and 72, respectively, of the circuit board 51.

Figure 9:
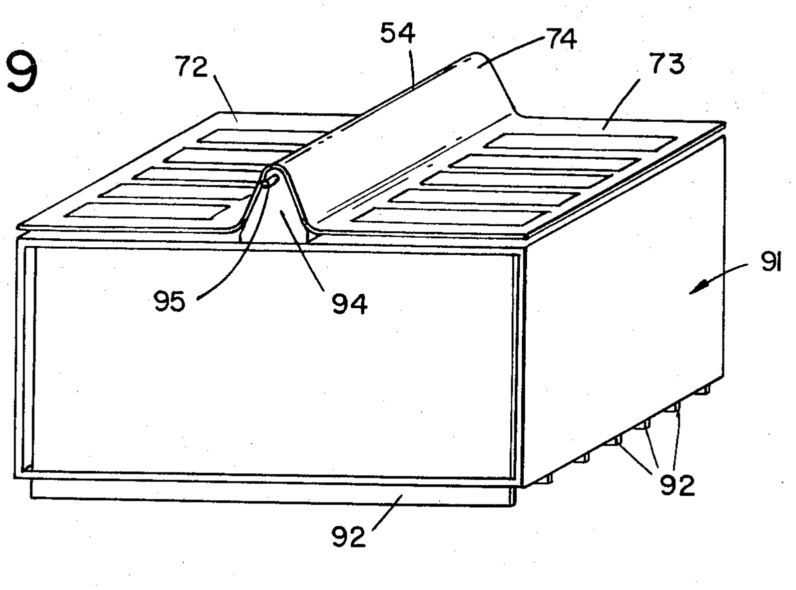
FIG. 9 is a perspective view from above of an alternative embodiment of a card cage mounting a circuit board according to the present invention.

FIG. 9 illustrates an alternate embodiment of a card cage 91 for use in accordance with the present invention. In most respects, this embodiment is essentially the same as the embodiment illustrated in FIGS. 8–8C, having conventional printed circuit cards 92, conventional edge connectors (not visible), a crest support 94, corona electrode wire 95. Essentially the same flexible circuit board 51 is used as that shown in FIGS. 8–8C although it will be noted that the edge connector flaps on opposite sides of the row of modulating apertures 54 are aligned, rather than staggered as shown previously since opposed pairs of flaps are associated with a single circuit card 92. As shown, the lateral sides 72 and 73 of the flexible circuit board lie in the same plane on either side of the crest portion 74. It will be apparent that each card 92 has two sets of circuitry since adjacent pairs of cards 80*a*, *b* in the previous embodiment are here combined.

C. Alternate Embodiments:

It will be noted that in the embodiments previously discussed, for example, as shown in detail at FIG. 6A, two offset rows of apertures 54 are employed as preferred. Thus, when one aperture row is spaced approximately and preferably slightly less than one aperture diameter from an adjacent apertures row, then apertures in one row can print dots which are aligned and preferably actually touch dots printed with the adjacent aperture row, provided the aperture rows are actuated sequentially and the print receiving medium is translated vertically in appropriately timed relation to the row actuation sequencing. This provides essentially full line coverage so that high quality character definition can be achieved.

Numerous variations can be made in the aperture patterns without departing from the spirit of the present invention. For example, instead of two offset rows of apertures accessed from opposite sides of the flexible aperture board (circuit board) as shown in FIG. 6, the two offset rows could, with slightly thinner leads 56 or annular conductive portions 55, be accessed from the same side, or four rows could be accessed, two from a side. Moreover, while the rows of apertures normally lie in a line generally perpendicular to the path of the paper, they can be disposed diagonally thereto or even randomly if desired.

It will be understood that these and other variations and modifications can be effected within the spirit and scope of the present invention as described hereinbefore and as defined in the appended claims.

D. Summary of Invention:

From the foregoing, it will be apparent that modulated aperture line printing requires a large number of apertures to be electrically accessed to driver circuitry. The difficulty of this task, due to crowding, increases inversely in relation to the aperture sizes and directly in relation to the numbers of the apertures, so that where it is desired to modulate an ion stream utilizing large numbers of very small apertures (by comparison to the larger sizes and smaller numbers of apertures employed to modulate a stream of charged toner particles) the value of the present invention in furnishing electrical access to the apertures can be readily appreciated. It will be further understood that the large numbers of electrical connections which must be made between the access circuitry and driver circuitry has been greatly facilitated by the fact that the circuit board is flexible and, therefore, can be conveniently connected in groups with conventional edge connectors.

The invention has been described in considerable detail with particular reference to certain preferred embodiments thereof, but it will be understood that variations and modifications can be effected without departrment from the spirit and scope of the invention.

I claim:

1. Apparatus for aperture modulated electrostatic printing, comprising:

- a substrate of dielectric material;
- a continuous electrode disposed on one side of said substrate;
- a plurality of apertures extending through both said substrate and said continuous electrode;
- a plurality of closely spaced electrical devices mounted in one or more straight and parallel rows on said substrate, each of said devices abutting one of said apertures; and
- a plurality of electrically conductive continuous strips fixedly attached to the other side of said substrate, each strip having a first section attached at one end to one of said electrical devices and extending in a direction generally perpendicular to said row or rows of electrical devices, and a second section extending from said first section in a direction generally parallel to said row or rows, said second sections of said strips being more widely center spaced at all points than any of said first sections of said, each of said electrical devices comprising an electrode abutting an aperture formed in said substrate.

2. Apparatus as recited in claim 1 wherein the junctions of said first and second sections lie in a line extending generally diagonally to said row or rows of electrical devices.

3. Apparatus as recited in claim 1 wherein some of said first sections of said continuous strips include segments which extend diagonally to the row or rows of electrical devices whereby opposed ends of such first sections are laterally displaced.

4. Apparatus as recited in claim 1 wherein each of said second sections terminates at a terminal contact pad, said terminal contact pads being mounted on said substrate in one or more straight and parallel rows extending in directions generally perpendicular to the row or rows of electrical devices.

5. Apparatus as recited in claim 4 wherein the junctions of said first and second sections lie in a line extending generally diagonally to said row or rows of electrical devices.

6. Apparatus as recited in claim 5 wherein some of said first sections of said continuous strips include segments which extend diagonally to the row or rows of electrical devices whereby the opposed ends of such first sections are laterally displaced.

7. Apparatus for aperture modulated electrostatic printing, comprising:

a substrate of dielectric material;

a continuous electrode disposed on one side of said substrate;

a plurality of apertures extending through both said substrate and said continuous electrode;

a plurality of closely spaced electrical devices, each associated with one of said apertures;

a plurality of substantially parallel electrically conductive continuous strips mounted on one side of said substrate, each strip having first and second sections, said first section extending in a generally longitudinal direction between one of said electrical devices and said second section, said second section extending between said first section and a terminal contact pad, said first and second sections intersecting and extending at an angle relative to one another; and a plurality of terminal contact pads mounted on said substrate in one or more straight and parallel rows extending in generally longitudinal directions, said pads center spaced more widely than said electrical devices.

8. Apparatus as recited in claim 7 wherein said first sections are substantially parallel to each other.

9. Apparatus as recited in claim 8 wherein said angle is substantially 90°.

10. Apparatus as recited in claim 8 wherein said second sections are substantially parallel to each other.

11. Apparatus as recited in claim 8 wherein said electrical devices are arranged in at least two straight parallel rows.

12. Apparatus as recited in claim 8 wherein said electrical devices are arranged in at least first and second straight parallel rows with laterally adjacent devices located in different rows.

13. Apparatus as recited in claim 12 wherein those of said first sections associated with said first row of electrical devices lead away from said devices from the side opposite said second row of electrical devices, and wherein those of said first sections associated with said second row of electrical devices lead away from said devices from the side opposite said first row of electrical devices.

14. Apparatus as recited in claim 8 wherein said electrical devices are arranged in at least one straight row.

15. Apparatus as recited in claim 14 wherein said first sections extend in a direction perpendicular to said row of electrical devices.

16. Apparatus as recited in claim 14 wherein said row of terminal pads extends in a direction substantially perpendicular to said row of electrical devices.

17. Apparatus as recited in claim 14 wherein said row of terminal pads extends in a direction substantially parallel to said first sections.

18. Apparatus as recited in claim 7 wherein the assembled substrate, continuous electrode and strips are flexible.

19. Apparatus recited in claim 18 wherein said terminal portions of said strips are arranged in at least one straight row.

20. The apparatus of claim 19 wherein a flexible flap is formed in said coated substrate in the region wherein said terminal portions are disposed.

21. Apparatus as recited in claim 20 wherein there are at least two of said flexible flaps disposed laterally of each other on said substrate, each of said flaps associated with a separate group of said aperture - terminal pairs.

22. Apparatus as recited in claim 20 wherein there are at least two of said flexible flaps disposed on either side of said rows of apertures, each of said flaps associated with a separate group of said aperture - terminal pairs.

23. Apparatus for aperture modulated electrostatic printing, comprising:

a substrate of dielectric material;

a continuous electrode disposed on one side of said substrate;

a plurality of apertures extending through both said substrate and said continuous electrode;

a plurality of closely spaced electrical devices, each associated with one of said apertures;

a plurality of electrically conductive leads disposed on said insulating layer each of said leads extending between one of said electrical devices and a terminal portion, said terminal portions of said leads arranged in one or more groups on a flexible flap formed in said substrate;

a frame having at least a first side for supporting siad substrate;

at least one edge connector mounted on said first side of said frame, said edge connector having at least one row of terminal prongs facing said mounting means and a groove facing oppositely for receiving the edge of a circuit card; and means for wedging said flap against said prongs to provide electrical contact between said prongs and said terminal portions.

24. Apparatus as recited in claim 23 wherein said electrical devices are arranged in one or more parallel row(s) on said mounting means; wherein there is at least one of said terminal portion bearing flaps disposed on either side of said row(s) of electrical devices; wherein said frame is provided with a second side and a central crested portion between said first and second sides of said frame; and wherein said first and second sides of said frame support at least one of said terminal portion bearing flaps, respectively and at least one of said edge connectors mounted on said second side for electrical connection with adjacent ones of said terminal portions.

25. Apparatus as recited in claim 24 wherein said mounting means is flexible and shaped to the configuration of said first and second sides and said crested portion of said frame; wherein said crested portion support said row(s) of electrical devices; wherein a corona ion source is disposed in said crested portion adjacent said electrical devices; and wherein said electrical devices are ion stream modulating apertures adapted for modulated aperture electrostatic printing.

26. Apparatus as recited in claim 25 wherein said frame is substantially rectangular in cross-section, said first and second sides of said frame lying in substantially perpendicular planes.

27. Apparatus as recited in claim 25 wherein said frame is substantially rectangular in cross-section, said first and second sides of said frame being coplanar.

28. An electrostatic printer head assembly comprising:

a. a flexible circuit board comprising
   i. a substrate of dielectric material;
   ii. a continuous electrically conductive coating disposed on one side of said substrate;
   iii. a plurality of apertures extending through both said substrate and said coating; and
   iv. a plurality of electrically conductive continuous strips mounted on the opposite side of said substrate from said coating, each of said strips having first and second sections, said first sections extending in a generally longitudinal direction between one of said apertures and said second section, said second section extending from said first section to a terminal portion, said first and second sections intersecting at an angle, said terminal portions center spaced more widely than said apertures to facilitate attachment to the terminal posts of external circuit card edge connectors, said terminal portions positioned on flexible flaps formed in said substrate;
b. a frame having a first side for supporting said flexible circuit board and a second side opposite said first side provided with a slot;
c. a circuit card carrying an electrical circuit disposed edgewise in said slot; and
d. an edge connector mounted on said first side of said frame and attached to said flap of said circuit board to provide separate electrical connections to each of the terminals on the flap, said edge connector having a groove which receives one edge of said circuit card to provide electrical connection with said circuit.

29. An electrostatic printer head assembly comprising:

a. a flexible circuit board having
   i. a flexible substrate of dielectric material;
   ii. a continuous flexible electrical coating disposed on one side of said substrate;
   iii. a plurality of apertures extending through both said substrate and said coating;
   iv. a plurality of electrically conductive flexible continuous strips disposed on the opposite side of said substrate from said continuous coating, each of said strips extending between and electrically connecting one of said apertures to a terminal pad; and
   v. a plurality of terminal pads disposed on the same side of said substrate as said continuous strips;
b. means for supporting said flexible circuit board;
c. a printed circuit card carrying an electrical circuit;
d. means supporting said printed circuit card with its edge adjacent said terminal pads of said flexible circuit board;
e. means for forming an electrical connection between said electrical circuit on said card and said terminals.

30. Apparatus as recited in claim 29 wherein said electrical connection forming means comprises a conventional printed circuit card edge connector.

31. Apparatus as recited in claim 30 wherein said edge connector has two parallel rows of terminal prongs projecting from one side thereof; and, further comprising an elongate filler block disposed between said rows of terminal prongs to wedge said circuit board flap between said block and said prongs and thereby urge said terminals on said circuit board against said terminal prongs of said edge connector to provide electrical connection therebetween.

* * * * *